(12) United States Patent
Yagi et al.

(10) Patent No.: US 6,429,465 B1
(45) Date of Patent: Aug. 6, 2002

(54) NITRIDE SEMICONDUCTOR DEVICE AND METHOD OF MANUFACTURING THE SAME

(75) Inventors: Shigeru Yagi; Toshihiko Suzuki; Nobuyuki Torigoe; Seiji Suzuki; Takeshi Iwanaga, all of Minamiashigara (JP)

(73) Assignee: Fuji Xerox Co., Ltd., Tokyo (JP)

(*) Notice: Subject to any disclaimer, the term of this patent is extended or adjusted under 35 U.S.C. 154(b) by 20 days.

(21) Appl. No.: 09/656,442

(22) Filed: Sep. 6, 2000

(30) Foreign Application Priority Data

Dec. 13, 1999 (JP) .......................................... 11-352667

(51) Int. Cl.[7] ............................................. H01L 33/00
(52) U.S. Cl. ......................... 257/103; 257/79; 257/615
(58) Field of Search ........................... 257/53, 103, 79, 257/615, 447, 448, 460, 461, 431, 94, 96, 627, 628; 136/256; 372/43

(56) References Cited

U.S. PATENT DOCUMENTS 5,192,717 A * 3/1993 Kawakami et al. ......... 439/233
5,909,036 A * 6/1999 Tanaka et al. ............... 257/103
5,986,285 A * 11/1999 Yagi ............................. 257/53
6,297,442 B1 * 10/2001 Yagi et al. .................. 257/615

OTHER PUBLICATIONS

Tokuda et al., Growth of GaN by Plasma–Assisted OMVPE, The Institute of Electronics, Information and Communication Engineers, pp. 25–30.

Goldys et al., Low Temperature Growth of Gallium Nitride on Quartz and Sapphire Substances, Materials Science Forum, vols. 264–268, pp. 1205–1208 (1998).

Park et al., Growth of GaN on Indium Tin Oxide/Glass Substances by RF Plasma Enhanced Chemical Vapor Deposition Method, Jpn. J. Appl. Phys., vol. 37 pp. L294–L296 (1998).

* cited by examiner

Primary Examiner—David Nelms
Assistant Examiner—Andy Huynh
(74) Attorney, Agent, or Firm—Oliff & Berridge, PLC

(57) ABSTRACT

A nitride semiconductor device of high quality and excellent crystallinity and the method of manufacturing the same, wherein a nitride series compound semiconductor having at least an element belonging to the group IIIA and nitrogen is grown directly on a substrate, X-ray diffraction peaks of the nitride series compound semiconductor consist only of the peaks from the C-face of the hexagonal system, and the half width of an X-ray rocking curve at (0002) peak in the C-surface is 0.2 degrees of less, and wherein the method includes a step of introducing an organic metal compound at least containing a group IIIA element and a plasma activated nitrogen source into a reaction vessel to grow a nitride series compound semiconductor on the surface of a substrate, in which the ratio for the amount of the group IIIA element and nitrogen atom supplied (ratio for the number of atoms) is group IIIA element: nitrogen atom=1:50,000 to 1:1,000,000.

7 Claims, 5 Drawing Sheets

NITRIDE SEMICONDUCTOR DEVICE AND METHOD OF MANUFACTURING THE SAME

BACKGROUND OF THE INVENTION

1. Field of the Invention

The present invention concerns a nitride semiconductor device for use in photoelectronic devices in blue and ultraviolet light regions and electronic devices operating at high temperature and high power, as well as the method of manufacturing the same.

2. Description of Related Art

Nitride series semiconductors having wide band gaps such as AlN, AlGaN, GaN, GaInN and InN have been noted as materials to be applied for photoelectronic devices in blue and ultraviolet light regions and electronic devices operating under severe circumstances at high temperature and high power, and a blue light emitting diode using GaN as a main material has been attained. At present, a molecular beam epitaxy (MBE) method and an organic metal chemical vapor deposition method (MOCVD) method have been adopted mainly for growing thin films of nitride series semiconductors. The MOCVD method is adapted for transporting starting materials in a gas phase and growing them by chemical reaction on a substrate, by which an ultra thin film can be formed and mixed crystal ratio can be controlled easily by controlling the flow rate. Further, since it is possible to grow crystals at high uniformity for a large area in principle, it is an industrially important method.

However, it requires a high temperature for decomposing ammonia mainly used as a nitrogen material in the MOCVD method and it requires a substrate temperature of 900 to 1200° C. in order to manufacture GaN crystals at high quality with a practical growing rate. Because of the high substrate temperature, it is difficult for lamination with a semiconductor which is broken at high temperature such as GaAs or GaP, which restricts the kind of substrates to be used.

Further, as the substrate for use in nitride semiconductor devices, sapphire substrates greatly different in the lattice constant have been used generally at present because bulk crystals are not available. However, due to the difference of the lattice constant, when a nitride series semiconductor is grown directly on a sapphire substrate, crystals of good quality usable for semiconductor devices can not be grown. In view of the above, a two stage growing method is used at present, in which an AlN film or a GaN film is grown at a low temperature as a buffer layer and, after elevating to a high temperature, crystals are grown subsequently. For the practical quality, it requires half width of 1.5 to 9 arcmin (0.025–0.15 degrees) in an X-ray rocking curve reflecting the fluctuation in the growing direction for crystals obtained by optimizing the buffer layer as reported by Nakamura, et al. It is considered that crystal nuclei is formed and enlarged by elevating the temperature of the buffer layer thus grown at a low temperature, thereby enabling to grow crystals during high temperature growth. Accordingly, it is difficult for the growth under the condition other than the high temperature growing condition in which crystallization proceeds effectively from amorphous or crystallite by thermal energy.

For the direct growing to a sapphire substrate, Tokuda, et al (Shingaku Giho: Technical Report of IEICE ED95-120, CPM 95-88 (1995-11) p25) reported that 13.2 arcmin (0.22 degrees) of half width for an X-ray rocking curve was obtained at a substrate temperature of 700 to 800° C. by a plasma assisted MOCVD method, but this half width of the X-ray rocking curve is not sufficient in view of the quality for use in semiconductor devices. According to their report, the ratio between the group VA element (group No. 15, according to the revised nomenclature in the inorganic chemistry of IUPAC in 1989) and the group IIIA element (group No. 13 according to the revised nomenclature in the inorganic chemistry of IUPAC in 1989), (atom number ratio: VA group element/group IIIA element) is (35700/1) or less and the high frequency power is 150 W. Further, it has been reported that degradation occurs particularly at 700° C. or lower under the conditions and crystals are grown as polycrystals. Accordingly, it has been difficult to directly grow a GaN film of high quality at a low temperature of 700° C. or lower on a sapphire substrate.

On the other hand, for fabricating an electronic device, it is necessary to laminate and grow on an electrode but high substrate temperature destroys an electrode material or causes change in the state of the boundary due to thermal reaction between the electrode material and the nitride series semiconductor to deteriorate electrical characteristics as the electronic device. In view of the above, since a high substrate temperature restricts the degree of freedom for the selection of semiconductors and electrodes laminated upon fabricating a device structure, it has been demanded for a low temperature growing method.

By the way, in converting the GaN semiconductor into a p type which is essential for the device fabrication, since an optimal method at present includes a thermal annealing method in a nitrogen atmosphere and annealing is conducted at a temperature of 600° C. or higher, low temperature growing causes a problem in the activation of Mg. In usual MOCVD method, a great amount of hydrogen and ammonia are used and Mg as a dopant for p-type conversion forms a composite compound with hydrogen and becomes inactive. In view of the problems, the plasma assisted MOCVD method can provide a low temperature growing method, as well as enables crystal growth even in a state of no substantial presence of hydrogen in the reaction system, so that this is an effective method capable of suppressing the inactivation of Mg.

However, most of nitride semiconductors manufactured by plasma assisted MOCVD method at a substrate temperature of 600° C. or lower are amorphous, polycrystals, mixed crystals of hexagonal system and cubic system and polycrystals in which plural orientation of crystals are present together, and half width in an XRD rocking curve of a specimen fabricated at 500 ° C. or lower shows a value greater by one digit or more compared with that of the high temperature MOCVD method (Materials Science Forum Vols. 264–286 (1998) 1205, Tokuda, et al, Technical Report of IEICE ED95-120, CPM95-88 (1995) 25, Jpn. J. Appl. Phys. Vol. 37 (1998) L294). Low crystallinity in the nitride semiconductor involves a problem of trapping of photoexcited or injected carriers in the semiconductor to an impurity energy level or extinction or deactivation, making it impossible for the use as light emitting/receiving devices.

SUMMARY OF THE INVENTION

For overcoming the foregoing problems in the prior art, the present invention intends to provide a nitride semiconductor device in which a nitride series compound semiconductor of high quality and excellent in crystallinity is grown directly on a substrate.

Further, the present invention intends to provide a method of manufacturing a nitride semiconductor device which can manufacture the nitride semiconductor device at a low substrate temperature.

As a result of the earnest study for overcoming the problem in the prior art, the present inventors have found that a nitride series compound semiconductor crystal can be grown directly on a substrate with no provision of a buffer layer and nitride series compound semiconductor crystals of high quality can be grown at a low temperature by making the ratio between the material of the element belonging to the group IIIA and the nitrogen material to be supplied to the substrate different from that of the prior art and by the energy possessed by superfluous excited nitrogen, and nitride series compound semiconductor crystals of high quality can be grown at a low temperature, and have accomplished the present invention.

The subject described above can be solved in accordance with the followings.

<1> A nitride semiconductor device in which a nitride series compound semiconductor having at least an element belonging to the group IIIA and nitrogen is grown directly on a substrate, X-ray diffraction peaks of the nitride series compound semiconductor only include the peaks from the C-face of a hexagonal system, and the half width of an X-ray rocking curve at (0002) peak of the C-face is 0.2 degrees or less.

<2> A nitride semiconductor device according to <1> above, wherein a reflection high-energy electron diffraction image shows a streak image.

<3> A nitride semiconductor device according to <1> above, wherein the substrate has sapphire.

<4> A nitride semiconductor device according to <1> above, wherein the nitrogen series compound semiconductor further contains a group II element.

<5> A nitride semiconductor device according to <1> above, wherein the nitrogen series compound semiconductor further contains a group IV element.

<6> A nitride semiconductor device according to <1> above, where the device has a light emittingproperty <7> A nitride semiconductor device according to <1> above, where the device has aphotoelectric conversion property.

<8> A method of manufacturing a nitride semiconductor device according to <1> above, which includes a step of introducing an organic metal compound at least containing a group IIIA element and a plasma activated nitrogen source into a reaction vessel to grow a nitride series compound semiconductor on the surface of a substrate, and in which the ratio for the amount of the group IIIA element and nitrogen atom supplied (ratio for the number of atoms) is group IIIA element: nitrogen atom=1:50,000 to 1:1,000,000.

<9> A method of manufacturing a nitride semiconductor device according to <8> above, wherein the substrate temperature is 600° C. or lower.

<10> A method of manufacturing a nitride semiconductor device according to <8> above, wherein the pressure in the reaction vessel is 100 Pa or lower <11> A method of manufacturing a nitride semiconductor device according to <8> above, wherein the organic metal compound containing the group IIIA element is introduced to the downstream in the flow of the plasma activated nitrogen source. <12> A method of manufacturing a nitride semiconductor device according to <8> above, wherein a carrier gas not containing hydrogen atoms is used. <13> A method of manufacturing a nitride semiconductor device according to <8>, wherein a discharge power of a plasma activated unit is 300 W or higher.

For growing nitride series compound semiconductor crystals of good quality, energy is required for migration of the material substance on the surface of the substrate or removing carbon and hydrogen from the inside of crystals, in addition to decomposition of starting material gases and reaction between the group IIIA element and the nitrogen atom. In the MOCVD method, the energy required for the crystal growth is supplied by the heat of a substrate heated to a high temperature from 900° C. to 1000° C. or higher.

On the other hand, in the crystal growth by the existent plasma assisted MOCVD method, the nitrogen material is decomposed by plasma discharge and the group IIIA element material is decomposed by active nitrogen and also by the heat energy of the substrate. In a case where the substrate temperature is low, migration of the material element and the removal of the impurities from the surface of crystals are not sufficient only by the heat energy from the substrate. This causes growing amorphous at high concentration of impurities such as carbon or hydrogen or polycrystals with no orientation.

In the method of manufacturing a nitride semiconductor device according to the present invention, in addition to decomposition of the starting group IIIA element gas, migration on the surface of crystals and removal of impurity elements are conducted by the energy of active nitrogen activated by plasmas, providing a nitride series compound semiconductor thin film of good quality having high crystallinity and with low concentration of residual impurities even at a low substrate temperature.

BRIEF DESCRIPTION OF THE DRAWINGS

Preferred embodiments of the present invention will be described in details based on the followings, wherein.

DETAILED DESCRIPTION OF THE PREFERRED EMBODIMENTS

Figure 1:
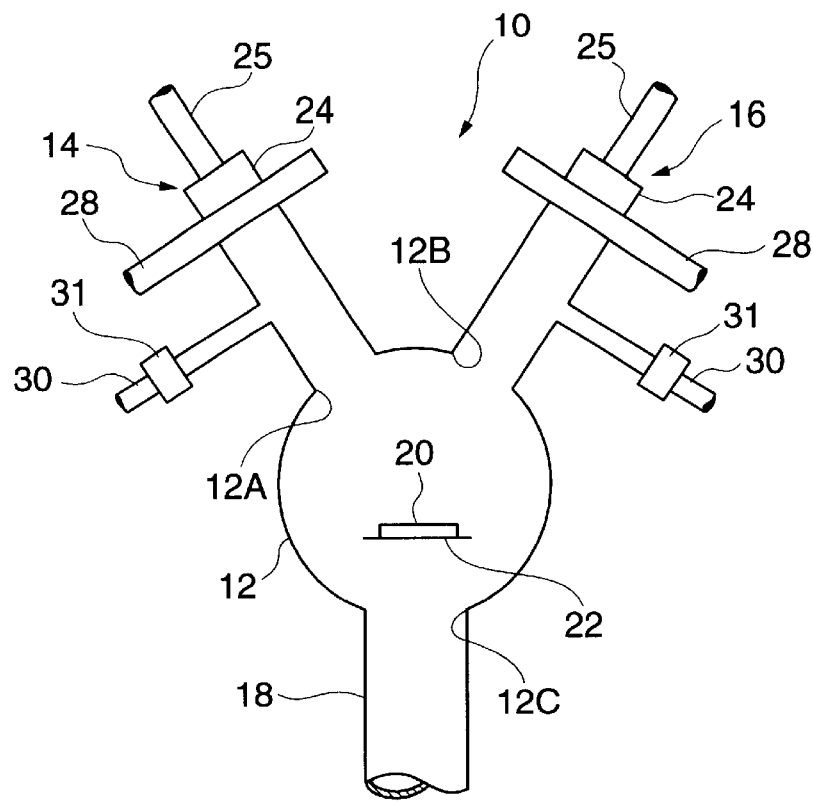
FIG. 1 is a schematic structural view of a semiconductor device manufacturing apparatus according to a first embodiment for manufacturing a semiconductor device according to the present invention.

This invention is to be explained in details.
[Nitride Semiconductor Device]

The nitride semiconductor device according to the present invention has a nitride series compound semiconductor and, optionally, other members on a substrate.

The nitride semiconductor device according to the present invention has a feature in that X-ray diffraction peaks of the semiconductor series compound semiconductor include only the peak from the C-face of a hexagonal system, and the half width of an X-ray rocking curve at (0002) peak of the c-face is 0.2 degrees or less.

The X-ray rocking curve shows the change of the X-ray diffraction intensity when a detector is set to a 2θ value for (0002) and the angle of the substrate is changed near the θ value, which can be measured by using an ordinary X-ray diffraction device.

When the half width in the X-ray rocking curve at (0002) peak on the C-face of the hexagonal system exceeds 0.2 degrees, transfer density in the crystals increases to form trapping for charge transfer and extinction center for emission. The half width is preferably 1.5 degrees or less.

On the other hand, the half width by measurement for θ–2θ for (0002) peak on the C-face of the hexagonal system of the nitride series compound semiconductor (X-ray diffraction spectrum) is preferably 0.5 degrees or less and, more preferably, 0.3 degrees or less. If the half width exceeds 0.5 degrees, crystallinity lowers to often increase amorphous portions or lamination defects in which lattice spacing is not uniform to often form traps for charge transfer and extinction centers for light emission.

Further, when the reflection high-energy electron diffraction image of the nitride series compound semiconductor shows a streak image, this indicates that the surface of the crystals is flat at the level of atoms and also represents that crystals grow uniformly in one identical direction, which is preferable as high quality crystals.

(Substrate)

The substrate used in the present invention may be insulative or conductive. When a conductive substrate is used for the substrate, it can be formed as it is into an electrode. If the substrate is insulative, it may be used as the electrode by applying an electrifying treatment to the insulative substrate. Further, the substrate used in the present invention may be either crystalline or amorphous.

The substrate can include crystals of metals such as aluminum, stainless steel, nickel and chromium and alloys thereof, semiconductors or single crystals such as of Si, GaAs, SiC and sapphire. Particularly, semiconductor crystal substrates of Si, GaAs, SiC and sapphire are suitable to epitaxial growing. Orientation and crystal form of the substrate can be selected optionally. Particularly, a-face and c-face of hexagonal sapphire crystals are preferred. Further, an orientated film of ZnO may be used as an intermediate layer.

Further, the insulative substrate can include, for example, polymeric film, glass and ceramic, and the metal described above or gold, silver, copper and the like is applied as a film by way of vapor deposition, sputtering or ion plating on the insulative substrate to apply electrifying treatment.

When the substrate is transparent, it can be used as a substrate for input/output of light. The light permeable base material constituting the transparent substrate usable herein can include transparent materials, for example, transparent inorganic materials such as glass, quartz and sapphire: films or plates of transparent organic resins such as polycarbonate and epoxy resins; and optical fibers and SELFOC optical plate.

When the light permeable base material is insulative, it may be used by applying an electrofying treatment and, for example, those formed by a method such as vapor deposition, ion plating or sputtering using a transparent conductive material such as ITO, zinc oxide, tin oxide, lead oxide, indium oxide or copper iodide or those formed to such a thin thickness to become transparent by vapor deposition or sputtering of Al, Ni or Au can be used. The film formed by the electrifying treatment can be used also as a light permeable electrode.

(Nitride Series Compound Semiconductor)

The nitride series compound semiconductor contains at least a group IIIA element and nitrogen and, optionally, other ingredients.

Nitrogen

Nitrogen used in the present invention can be introduced from at least one of a gas introducing tube 25 to be described later. As a nitrogen source, a gas such as $N_2$, $NH_2$, $NF_3$, $N_2H_4$, monomethyl hydrazine or dimethyl hydrazine or a gas mixture formed by bubbling the same with a carrier gas can be used.

As the carrier gas, a rare gas such as He or Ar, a single element gas such as $H_2$ or $N_2$, a hydrocarbon such as methane or ethane or a halogenated carbon such as $CF_4$ or $C_2F_6$ can be used.

Group IIIA Element

The group IIIA element used in the present invention can be introduced from at least one end of a gas introducing tube 30 to be described later and is preferably used as an organic metal compound containing a group IIIA element. As the organic metal compound containing the group IIIA element, a liquid or solid such as trimethyl aluminum, triethyl aluminum, t-butyl aluminum, trimethyl gallium, triethyl gallium, t-butyl gallium, trimethyl indium, triethyl indium or t-butyl indium can be used by gasification, alone or as a gas mixture formed by bubbling with the carrier gas. The organic metal compound containing the group IIIA element may be used alone or two or more of them may be used in combination.

Other Ingredients

As an auxiliary material for reaction with organic functional groups of the organic metal compound containing the group IIIA element and removing the organic functional groups out of the reaction system, a rare gas such as He, Ne or Ar or a halogen gas such as $H_2$, $Cl_2$ or $F_2$ may be used alone or in admixture. Further, such an auxiliary material may be used in admixture with a nitrogen compound. The auxiliary material can be used optionally for preventing film defects by energy control of the active species or making the organic functional groups into inactive molecules.

Further, a compound containing an element for the control of p or n conduction type can be introduced through the gas introducing tube 30 and doped into a film. The doping gas may be mixed with the organic metal compound containing the group IIIA element or introduced separately. Further, the dopant may be introduced simultaneously with the organic metal compound or introduced successively.

As the element for the n-type, used are: Li in group IA (group No. 1 according to revised edition of Inorganic Chemistry Nomenclature from IUPAC in 1989); Cu, Ag, Au in group IB (group No. 11 according to revised edition of Inorganic Chemistry Nomenclature from IUPAC in 1989); Mg in group IIA (group No. 2 according to revised edition of Inorganic Chemistry Nomenclature from IUPAC in 1989); Zn in group IIB (group No. 12 according to revised edition of Inorganic Chemistry Nomenclature from IUPAC in 1989); Si, Ge, Sn and Pb in group IVA (group No. 14 according to revised edition of Inorganic Chemistry Nomenclature from IUPAC in 1989); and S, Se and Te in group VIA (group No. 16 according to revised edition of Inorganic Chemistry Nomenclature from IUPAC in 1989). Among them, Si, Ge and Sn are preferred in view of the controllability for charge carriers.

As the element for p-type, used are: Li and Na in group IA; Cu, Ag, Au, in group IB; Be, Mg, Ca, Sr, Ba and Ra in group IIA; Zn, Cd and Hg in group IIB; C, Si, Ge, Sn and Pb in group IVA; Cr in group VIB (group No. 6 according to revised edition of Inorganic Chemistry Nomenclature from IUPAC in 1989); Fe in group VIII (group No. 19 according to revised edition of Inorganic Chemistry Nomenclature from IUPAC in 1989); Co (group No. 9 according to revised edition of Inorganic Chemistry Nomenclature from IUPAC in 1989); and Ni (group No. 10 according to revised edition of Inorganic Chemistry Nomenclature from IUPAC in 1989) and the like. Among them, Be, Mg, Ca, Zn and Sr are preferred in view of the controllability for charge carriers.

For the doping, $SiH_4$, $Si_2H_6$, $GeH_4$, $GeF_4$ and $SnH_4$ can be used for n-type and $BeH_2$, $BeCl_2$, $BeCl_4$, cyclopentadiethyl magnesium, dimethyl calcium, dimethyl strontium, dimethyl zinc and diethyl zinc can be used for p-type in a gaseous state. Further, the doping element can be diffused as it is in the film, or can be incorporated as ions into the film.

The nitride semiconductor device of the present invention having the constitution described above can be used suitably as a light emitting device or a photoconductive device. The light emitting device or the photoconductive device using the nitride semiconductor device according to the present invention is excellent in view of the degree of freedom for the constitution of the device and less formation of defects caused by the difference in the thermal expansion coefficient.

The nitride semiconductor device of the present invention having the constitution described above can be manufactured suitably by the method of manufacturing the nitrogen semiconductor device according to the present invention to be described later. Further, in the method of manufacturing the nitride semiconductor device according to the present invention to be described later, materials such as the group IIIA element, the nitrogen source and other ingredients described above can be used suitably.

[Method of Manufacturing the Nitride Semiconductor Device]

The method of manufacturing the nitride semiconductor device according to the present invention includes a step of introducing an organic metal compound at least containing a group IIIA element and a plasma activated nitrogen source into a reaction vessel to grow a semiconductor series compound semiconductor on the surface of a substrate, in which the ratio of the amount of the group IIIA element and the nitrogen atom supplied (ratio for the number of atoms) is: group IIIA element:nitrogen atom=1:50,000 to 1:1,000,000.

The present invention is different from the existent plasma assisted MOCVD method in increasing the ratio of the nitrogen material relative to the group IIIA element material supplied into the reaction vessel, thereby increasing excited nitrogen that can reach the surface of the substrate and contribute to crystal growth, and can provide a nitride series compound semiconductor of high crystallinity with uniform lattice constant and orientation by the provision of a large kinetic energy to the starting material element from the superfluously excited nitrogen.

Further, hydrogen atoms in the organic metal compound containing the group IIIA element excited by the superfluously excited nitrogen disconnects bondings between the group IIIA element or nitrogen atom and carbon atom or hydrogen atom on the growing surface and, as a result, reduces incorporation of impurity atoms such as hydrogen or carbon by extraction abstraction reaction.

In the present invention if the ratio for the amount of the group IIIA element and the nitrogen atom supplied (ratio for the number of atoms:nitrogen atom/group IIIA element) is less than (50,000/1), the half width in the X-ray rocking curve of the nitride series compound semiconductor crystals grown directly on the substrate exceeds 0.2 degrees to lower the crystallinity and also increase defects, so that it is no more suitable to the semiconductor device. On the other hand, if the ratio for the number of atoms exceeds (1,000,000/1), it is not preferred since the amount of the group IIIA element on the growing surface is extremely reduced and can no more grow in a three dimensional manner. The ratio for the amount of the group IIIA element and the nitrogen atom supplied (atom number ratio) is preferably group IIIA element:nitrogen atom=1:70,000 to 1:500,000. The ratio for the amount of supply means the ratio for the number of atoms contained in the starting compound supplied for unit time. For example, in a case of a nitrogen gas, the number of nitrogen atom is twice as much as the amount of the starting material gas. In this case, when the flow rate of the starting group IIIA element gas and the nitrogen changes with time, for example, by the supply under modulation, the ratio is defined as a mean flow rate ratio.

In the present invention, since the energy necessary for crystal growth is supplied by the plasma excited nitrogen, a semiconductor or an electrode that would be decomposed and broken at high temperature can be used for the device constitution by lowering the substrate temperature.

The substrate temperature is usually about 20° C. to 1200° C. and, preferably, 100° C. to 600° C. in view of the degree of freedom for the selection of the substrate. The substrate temperature can be changed optionally in accordance with the purpose of the film to be grown.

When the substrate temperature is low, crystals of good quality can be obtained by decreasing the ratio of the group IIIA element and the nitrogen and increasing the discharge energy.

In the present invention, the group IIIA element and the excited nitrogen can reach the surface of the substrate easily by reducing the pressure in the reaction vessel to a low pressure of 100 Pa or lower, by which the active nitrogen can be increased on the surface of the substrate in cooperation with the high ratio for the number of atoms (nitrogen atom/group IIIA element).

Further, by introducing the organic metal compound containing the group IIIA element to the down stream for the flow of the plasma activated nitrogen source, semiconductor crystals can be grown selectively on a substrate situating downstream for the flow of the material gas.

The organic metal compound containing the group IIIA element generally has a small molar flow rate when introduced into the reaction vessel upon film formation. Thus it has introduced after dilution with a carrier gas such as hydrogen or nitrogen. Since the carrier gas is introduced with no excitation into the reaction vessel, it collides against the plasma activated excited nitrogen to decrease the amount of the excited nitrogen supplied to the surface of the substrate. This causes incorporation of impurities into the crystals or incomplete crystal growth. By introducing only the group IIIA element gas directly into the reaction vessel without using the carrier gas, the excited nitrogen can reach to the surface of the substrate with no wasteful consumption to improve the crystallinity.

Further, when a carrier gas containing hydrogen atoms is used, magnesium as a dopant for p-type conversion forms a composite compound with hydrogen and is inactivated, so that a carrier gas not containing hydrogen atom is preferred in a case of using the carrier gas.

The method of manufacturing a nitride semiconductor device according to the present invention is to be explained in details with reference to the drawings of a semiconductor device manufacturing apparatus.

FIG. 1 shows a schematic constitution of a semiconductor device manufacturing apparatus 10 according to a first embodiment for manufacturing the nitride semiconductor device according to the present invention. The semiconductor device manufacturing apparatus 10 has a cylindrical reactor 12; first and second starting material activating-supplying portions 14 and 16 in contiguous through openings 12A and 12B with the reactor 12; an exhaust tube 18 in contiguous through an opening 12C with the reactor 12 for exhausting a gas inside of the reactor 12; a substrate holder 20 disposed in the reactor 12 for supporting a substrate; and a heater 22 disposed to the substrate holder 20 on the side opposite to the surface for mounting the substrate.

The first and the second starting material activating-supplying portions 14 and 16 have constitution identical with each other and have each a cylindrical quartz tube 24 in communication with the reactor 12 and disposed radial outside of the reactor 12; a gas introducing tube 25 in communication with the quartz tube 24 on the side opposite to the reactor 12; a microwave guide tube 28 disposed crossing the quartz tube 24; and a gas introducing tube 30 in contiguous with the quartz tube 24 on the side nearer to the reactor 12 than the crossing point between the quartz tube 24 and the microwave guide tube 28. The microwave guide tube 28 is a box-like configuration through which the quartz tube 24 penetrates.

Then, the gas introducing tubes 25 and 30 for the first and the second starting material activating-supplying sections 14 and 16 are connected respectively to reservoirs as starting material supplying units not illustrated.

Further, the gas introducing tube 30 is connected with a flow rate controller 31 for supplying a starting material gas. Further, the microwave guide tube 28 is connected with a microwave oscillator using a magnetron not illustrated and causes electric discharge in the quartz tube 24. Further, the exhaust tube 18 is connected with a pump as an exhaust unit, not illustrated, for exhausting the inside of the reactor 12 approximately to a vacuum state.

Figure 2:
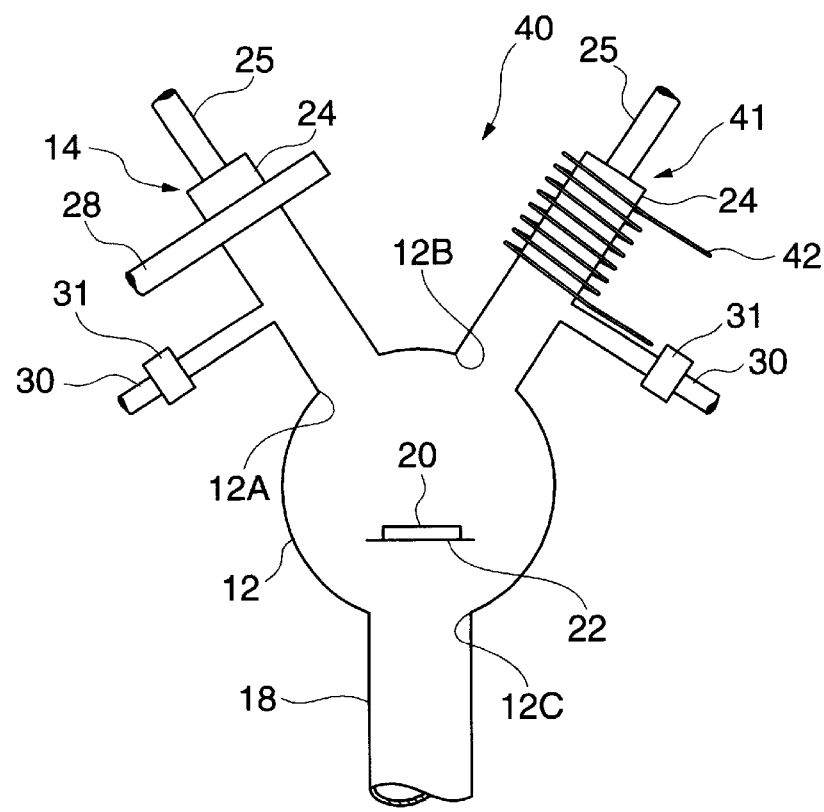
FIG. 2 is a schematic structural view of a semiconductor device manufacturing apparatus according to a second embodiment for manufacturing a semiconductor device according to the present invention.

Further, FIG. 2 shows a semiconductor device manufacturing apparatus 40 according to a second embodiment for manufacturing the nitride semiconductor device according to the present invention. In the semiconductor device manufacturing apparatus 40 of the second embodiment, constitutions identical with those of the semiconductor device manufacturing apparatus 10 of the first embodiment carry the same reference numerals for which duplicate explanation is omitted.

The semiconductor device manufacturing apparatus 40 has a second starting material activating-supplying portion 41 instead of the second starting material activating-supplying portion 16 in the semiconductor device manufacturing apparatus 10. The second starting material activating-supplying portion 41 uses high frequency coils 42 instead of the microwave guide tube 28, and the high frequency coils 41 are wound around the outer circumference of a quartz tube 24 and connected with a high frequency oscillator not illustrated.

In the semiconductor device manufacturing apparatuses 10 and 40, only the first starting material activating-supplying portion 14 may be used and, for example, a nitrogen source is supplied continuously from the gas introducing tube 25 of the first starting material activating-supplying portion 14 and plasma activated by microwave discharge. By supplying the organic metal compound containing a group IIIA element from the gas introducing tube 30 of the first starting material activating-supplying portion 14, a nitride series compound semiconductor having a group IIIA element and nitrogen can be grown on the substrate.

Further, in the second starting material activating supplying portions 16, 41, a doping material can be supplied from the gas introducing tube 25 without operating the activating unit. Further, nitrogen or hydrogen can be supplied continuously and activated in the second starting material activating-supplying portions 16, 41, and a doping material containing a group II element or a group IV element can be supplied from the gas introducing tube 30. In this case, two or more organic metal compounds containing the group IIIA element or the doping material can be introduced from the gas introducing tube 30 of the first and the second starting material activating-supplying portions 14, 16 and 41. Further, the organic metal compound containing the group IIIA element can be mixed and supplied simultaneously from the gas introducing tubes 30 of the second starting material activating-supplying portions 16 and 41. Such organic metal compounds can be supplied continuously or intermittently or they may be supplied also alternatively.

Further, in the semiconductor device manufacturing apparatus 10 and the semiconductor device manufacturing apparatus 40, the nitrogen source can be supplied from the gas introducing tube 25 of the first starting material activating-supplying portion 14, and the organic metal compounds containing the group IIIA element different from each other can be supplied simultaneously or so as not to overlap with each other from the gas introducing tubes 30 of the first and the second starting material activating-supplying portions 14, 16 and 41. Then, the charging conditions and the gas flow rate can be varied in each of the starting material activating-supplying portions for changing the activating conditions of nitrogen in accordance with the bonding energy for each of the organic metal compounds. Accordingly, films with less incorporation of impurities or films of mixed crystals at high quality can be formed by using the semiconductor device manufacturing apparatus 10 and the semiconductor device manufacturing apparatus 40.

Figure 3:
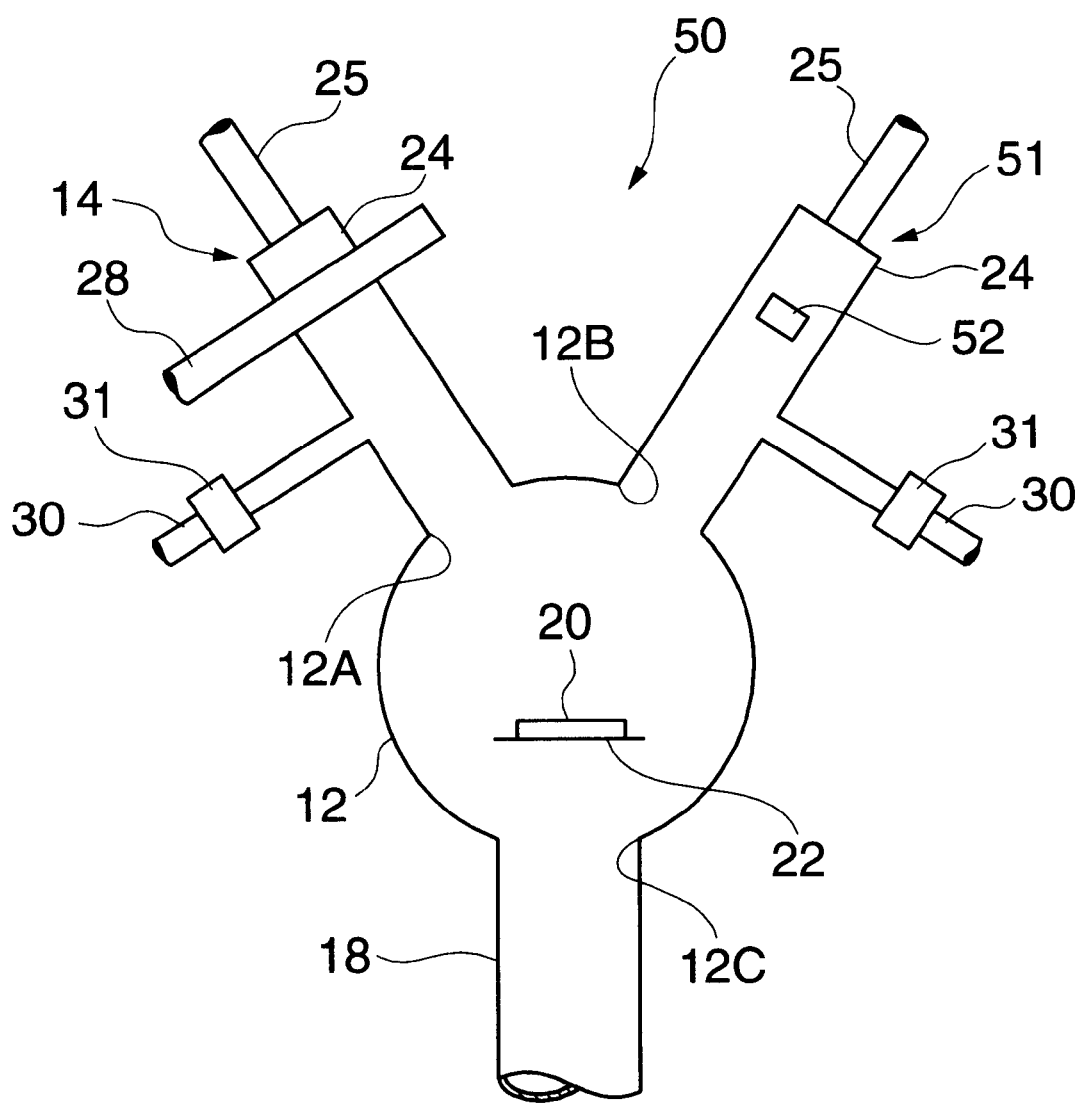
FIG. 3 is a schematic structural view of a semiconductor device manufacturing apparatus according to a third embodiment for manufacturing a semiconductor device according to the present invention.
Figure 4A:
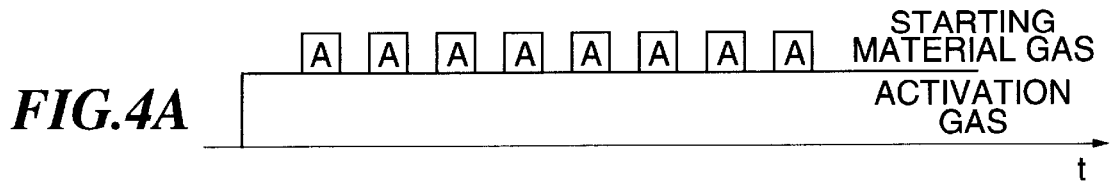
FIG. 4 explains a method of introducing an organic metal compound containing a group IIIA element.
Figure 4B:
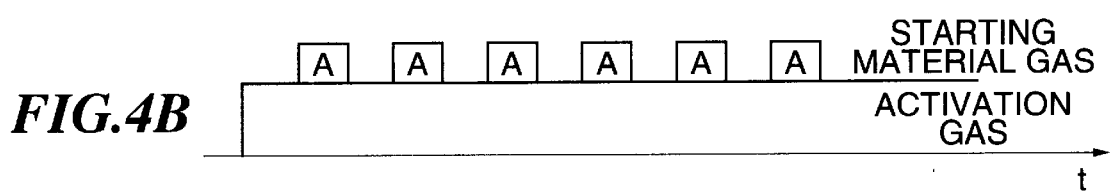
Figure 4C:
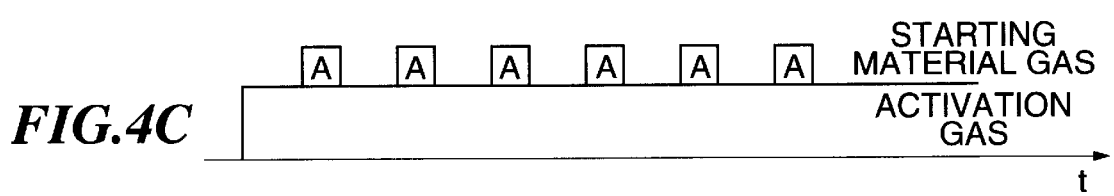
Figure 4D:
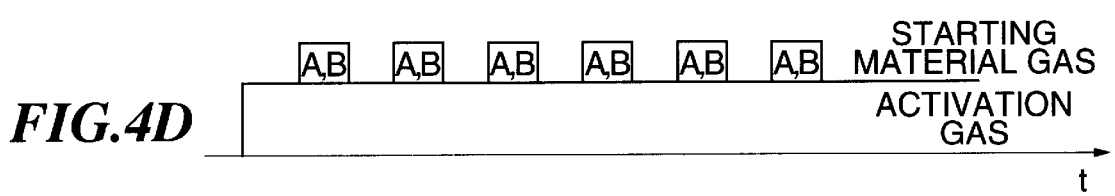
Figure 4E:
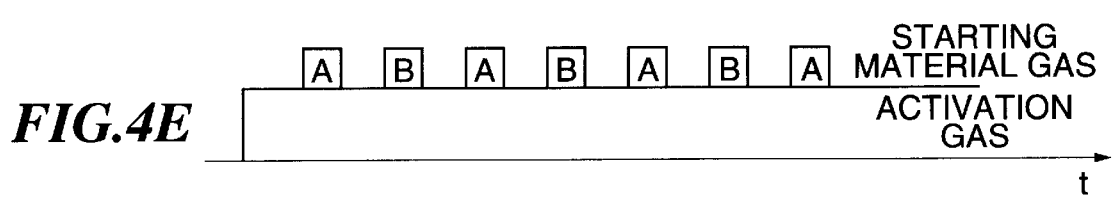
Figure 4F:
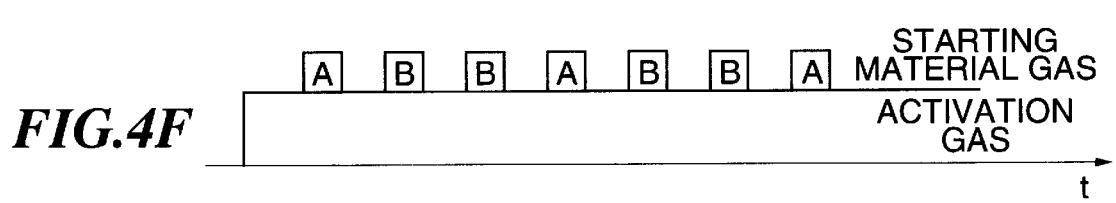
Figure 4G:
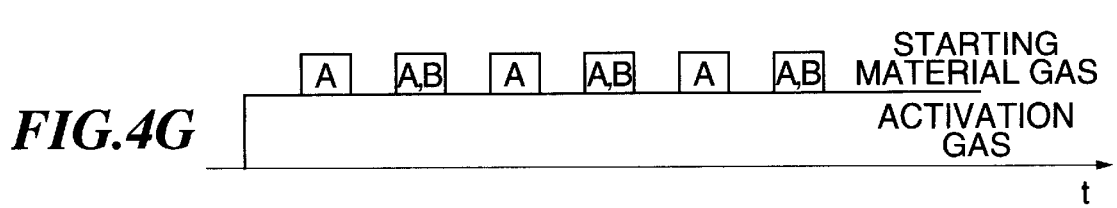

Further, FIG. 3 shows a semiconductor device manufacturing apparatus 50 of a third embodiment for manufacturing the nitride semiconductor device according to the present invention. In the semiconductor device manufacturing apparatus 50 of the third embodiment, constitutions identical those in the semiconductor manufacturing apparatus 10 of the first embodiment carry the same reference numerals for which duplicate explanation is to be omitted.

The semiconductor device manufacturing apparatus 50 has a second starting material activating-supplying portion 51 instead of the second starting material activating-supplying portion 16 in the semiconductor device manufacturing apparatus 10, and a high frequency discharge electrode 52 disposed in a quartz tube 24 is used for causing capacitance coupling type discharge instead of the microwave discharge tube 28 in the second starting material activating-supplying portion 51.

In a case where the organic metal compound containing the group IIIA element intermittently, ON-OFF operation may be conducted by an external signal using a mass flow controller, or it may be conducted by opening/closing of a valve or switching of valves. FIG. 4 shows examples of time sequence upon introduction. In a case of intermittently introducing the organic metal compound containing the group IIIA element, gas introducing time and recess time may be identical (4A) or different (4B & 4C). Further, different starting materials may be mixed and introduced intermittently (4D). Further, different starting materials may be alternatively introduced intermittently (4E), or either one of them may be supplied repetitively (4F). Furthermore, a single component starting material and a mixture of starting material gases may be supplied alternatively (4G). By supplying plural starting materials, mixed crystal compounds of optional compositions can be obtained.

Further, intermittent introduction may be conducted by an operation along a rectangular waveform or an operation along a smooth sinusoidal curve. Furthermore, the frequency may be from 0.01 to 100 Hz assuming a combination of the introduction time and the recess time as one period. The frequency should be in accordance with the growing rate of the film such that the frequency is lower when the growing rate is lower and the frequency is higher when the growing rate is higher and it is desirably set as one period to several periods for one layer.

In the present invention, the method of activation in the starting material activating-supplying portion may be any of high frequency discharge, microwave discharge, electron cyclotron resonance system or helicon plasma system, or it may be by a heating filament. These methods may be used alone or two or more of them may be used in combination. Further, in a case of high frequency discharge, an induction coupling type as in the second embodiment or the capacitance coupling type as in the third embodiment may be adopted. As the discharging power of the plasma activation unit, 50 W or more of the power may be used and 300 W or more is further preferred. This may be the sum of power when two or more of the activating units is used. By increasing the discharging power of the plasma activation unit to 300 W or higher, it is possible to generate a great amount of excited nitrogen to grow semiconductor crystals of good quality without relying on the substrate temperature.

In a case of using two or more kinds of activating methods in one space, it is necessary that discharges can be generated simultaneously under an identical pressure, and a pressure difference may be disposed between the inside of the microwave guide tube (or high frequency wave guide tube) and the inside of the quartz tube (or in the reactor). Further, when the pressure is made identical, the activating energy for the active species can be changed greatly by using different starting material activating unit, for example, microwave discharge and high frequency wave discharge to control the film quality.

EXAMPLE

Examples of the present invention will be explained.

Example 1

A nitride semiconductor device was manufactured by using the semiconductor device manufacturing apparatus 10 shown in FIG. 1. That is, a sapphire substrate with (0001) face was set to the substrate holder 20, the substrate temperature was controlled to 380° C. by the substrate heater 22, and nitrogen was introduced from the gas supplying tube 25 of the first starting material activating-supplying portion 14 at a flow rate of 2 L/min into the reactor 12. The pressure inside the reactor 12 was controlled to 45 Pa. A nitrogen gas passing through the microwave guide tube 28 of the first starting material activating-supplying portion 14 was plasma-discharged by a microwave at 2.45 GHz. The microwave power in this case was set to 400 W.

Then, trimethyl gallium was introduced as it was from the gas introducing tube 30 of the first starting material activating-supplying portion 14 into the reactor 12 to grow gallium nitride directly on the sapphire substrate. Trimethyl gallium described above was introduced at a flow rate changing in the form of a square wave with a maximum flow rate of 2.0 μmol/min and a minimum flow rate of 0 μmol/min each at 10 sec. The meal flow rate of trimethyl gallium described above was 1.0 μmol/min in which the atom number ratio between the group IIIA element and the nitrogen atom was group IIIA element:nitrogen atom= 1:178000. The second starting material activating-supplying portion 16 was not used. After growing crystals for 90 min under the conditions described above, the temperature of the substrate was lowered to a room temperature in the nitrogen flow and a nitride semiconductor device was taken out of the reactor 12. The crystal growing rate under the condition was 0.14 μm/h.

Figure 5:
FIG. 5 shows an RHEED pattern for gallium nitride obtained in Example 1.

For the gallium nitride crystals of the thus manufactured nitride semiconductor device, an RHEED pattern was observed and an X-ray diffraction spectrum was measured. FIG. 5 shows the RHEED pattern observed by using a reflection high-energy electron diffraction apparatus MB-1000 model (manufactured by Seiko Engineering Co.) at an acceleration voltage of 30 KV. In a case of growing a nitride series compound semiconductor at a low substrate temperature of 500° C. or lower in the existent plasma assisted MOCVD method, the product was polycrystal or amorphous and a not definite ring pattern was reported. On the other hand, a streak image was observed for the gallium nitride crystals of the nitride semiconductor device obtained as described above, and it can be seen that the product is single crystals of good flatness.

Figure 6:
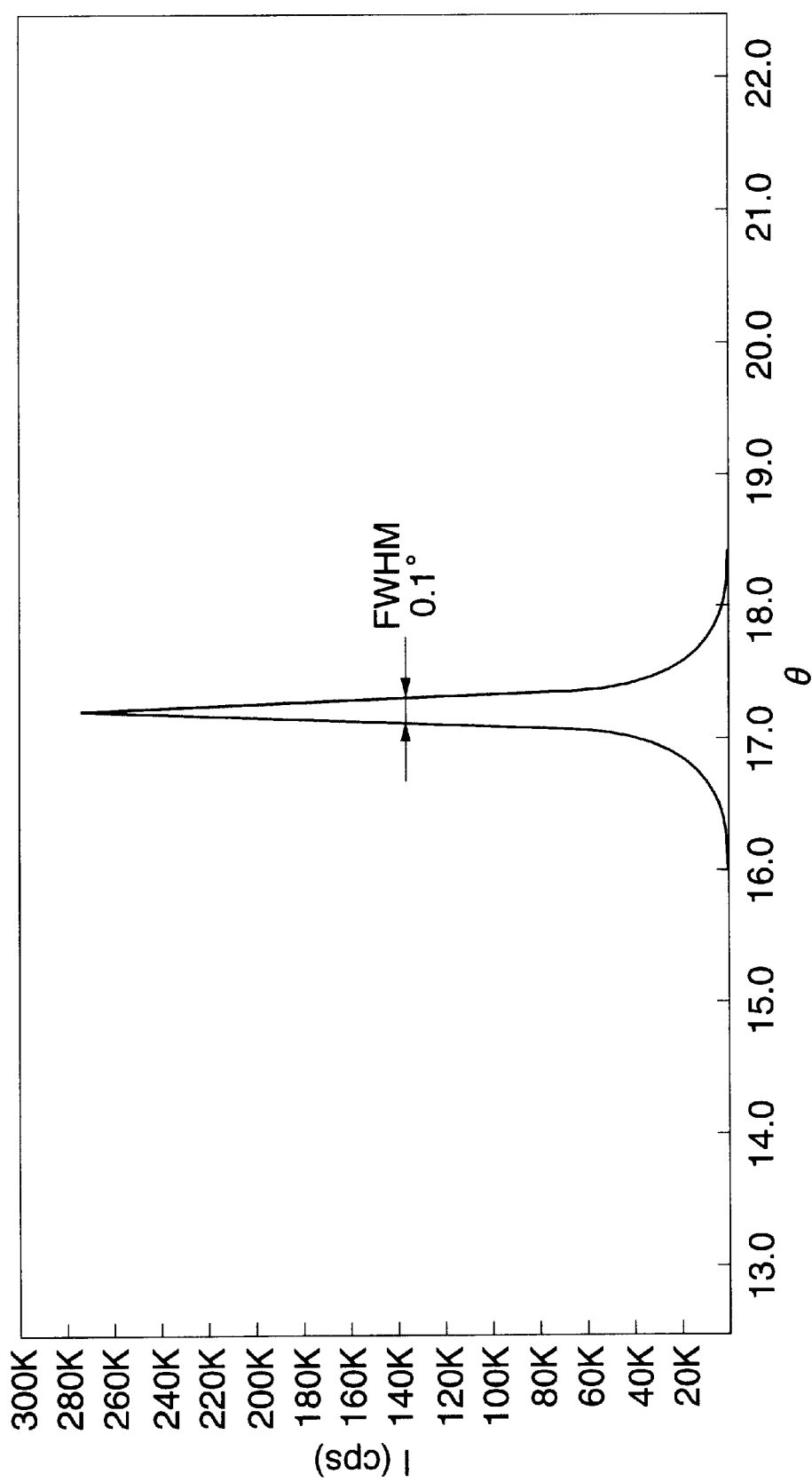
FIG. 6 is an X-ray rocking curve for gallium nitride obtained in Example 1.

X-ray diffraction spectrum and X-ray rocking curve were measured by using X-ray diffraction apparatus MXP18 of Bragg-Bren-tano geometry (manufactured by MAC Science Co.). The observed X-ray diffraction peaks including only the peaks from the C-face of single crystal GaN of hexagonal system and X-ray diffraction peaks from other orientation or cubic system were not observed. The half width according to θ–2θ measurement for the (0002) diffraction peak on the C-face was 0.10 degrees. Further, FIG. 6 shows an X-ray rocking curve measured by using the X-ray analyzer. The observed half width of the X-ray rocking curve was 0.10 degrees. These values show the crystallinity usable as the device for the nitride semiconductor device prepared by directly growing the nitride series compound semiconductor on the substrate without providing the buffer layer.

When the mean flow rate of trimethyl gallium was changed from 0.5 μmol/min to 4.0 μmol/min under the conditions described above, the crystal growing rate was increased in proportion with the flow rate of trimethyl gallium.

Example 2

A nitride semiconductor device was manufactured by using the semiconductor device manufacturing apparatus 50 shown in FIG. 3. That is, a sapphire substrate with (0001) face was set to the substrate holder 20, the substrate temperature was controlled to 380° C. by the substrate heater 22, and nitrogen was introduced at a flow rate of 2 L/min from the gas supplying tube 25 of the first starting material activating-supplying portion 14 into the reactor 12. The nitrogen gas passing through the microwave guide tube 28 of the first starting material activating-supplying portion 14 was plasma-discharged by a microwave at 2.45 HGz. In this case, the microwave power was set to 400 W. Further, nitrogen was introduced at a flow rate of 1 L/min from the gas introducing tube 25 of the second starting material activating-supplying portion 51 into the reactor 12. The nitrogen gas was caused to discharge by the high frequency at 13.56 MHz. In this case, rf power was set to 100 W. The pressure in the reactor 12 was controlled to 50 Pa.

Then, in the same manner as in Example 1, trimethyl gallium was introduced from the gas introducing tube 30 of the first starting material activating-supplying portion 14 into the reactor 12 and, further, biscyclopentadienyl magnesium heated to 50° C. was introduced using nitrogen as a carrier gas from the gas introducing tube 30 of the second starting material activating-supplying portion 51 into the reactor 12 to directly grow magnesium-doped gallium nitride on the sapphire substrate. After growing crystals for 90 min under the conditions described above, the temperature of the substrate was lowered to a room temperature in the nitrogen flow, and the nitride semiconductor device was taken out of the reactor 12. The crystal growing rate under the condition was 0.14 µm/h.

For the gallium nitride crystals of the manufactured nitride semiconductor device, an RHEED pattern was observed and an X-ray diffraction spectrum was measured. The RHEED pattern showed a small spot pattern. Further, in the X-ray diffraction spectrum, the X-ray diffraction peaks including only the peaks from the C-face of hexagonal GaN system and no X-ray diffraction peaks from other orientation or cubic system were not observed. The half width according to θ–2θ measurement for (0002) diffraction peak on the C-face was 0.11 degrees and the half width of the X-ray rocking curve was 0.14 degrees. These values show the crystallinity usable as the device for the nitride semiconductor device prepared by directly growing the nitride series compound semiconductor on the substrate without providing the buffer layer.

Au electrode pair each having 400 µm length and 100 µm width with a space of 100 µm was fabricated by vacuum vapor deposition on the film manufactured in Example 2. When a voltage at 10 V was applied to the electrode and a photocurrent spectrum was measured, the cutting ratio for the photocurrent at UV and visible light of 500 nm was as large as three digit and it could be used as a visible blind UV sensor of high quality.

Further, a light emitting device was formed by using the GaN film in Example 1 and the magnesium doped gallium nitride film in Example 2 by deposit an AlGaN film of 50 nm on the GaN film in Example 1, a GaInN film of 30 nm was formed thereon and, further, an AlGaN film was formed further thereon. The multi-layered film was formed repetitively for 3 to 10 layers, on which the film in Example 2 was formed. A light emitting device can be formed by using In as an electrode to n-type GaN and using Ni as a p-type electrode.

What is claimed is:

1. A nitride semiconductor device in which a nitride series compound semiconductor comprising at least an element belonging to the group IIIA and nitrogen is grown directly on a substrate, X-ray diffraction peaks of the nitride series compound semiconductor consist only of the peaks from the C-face of a hexagonal system, and the half width of an X-ray rocking curve at (0002) peak of the C-face is 0.2 degrees or less.

2. A nitride semiconductor device according to claim 1, wherein a reflection high-energy electron diffraction image shows a streak image.

3. A nitride semiconductor device according to claim 1, wherein the substrate has sapphire.

4. A nitride semiconductor device according to claim 1, wherein the nitrogen series compound semiconductor further contains a group II element.

5. A nitride semiconductor device according to claim 1, wherein the nitrogen series compound semiconductor contains a group IV element.

6. A nitride semiconductor device according to claim 1, wherein the device has a light emitting property.

7. A nitride semiconductor device according to claim 1, wherein the device has a photoelectric conversion property.

* * * * *